United States Patent
Choi et al.

(10) Patent No.: US 9,614,016 B2
(45) Date of Patent: Apr. 4, 2017

(54) ORGANIC LIGHT-EMITTING DIODE (OLED) DISPLAY AND METHOD OF MANUFACTURING THE SAME

(71) Applicant: Samsung Display Co., Ltd., Yongin, Gyeonggi-Do (KR)

(72) Inventors: Jong-Hyun Choi, Seoul (KR); Shin-Moon Kang, Seoul (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/536,035

(22) Filed: Nov. 7, 2014

(65) Prior Publication Data

US 2015/0137097 A1    May 21, 2015

(30) Foreign Application Priority Data

Nov. 21, 2013  (KR) .......................... 10-2013-0141917

(51) Int. Cl.
| | |
|---|---|
| *H01L 27/32* | (2006.01) |
| *H01L 51/52* | (2006.01) |
| *H01L 51/56* | (2006.01) |

(52) U.S. Cl.
CPC ...... *H01L 27/3258* (2013.01); *H01L 27/3279* (2013.01); *H01L 51/5212* (2013.01); *H01L 51/5228* (2013.01)

(58) Field of Classification Search
None
See application file for complete search history.

(56) References Cited

U.S. PATENT DOCUMENTS

| | | | | |
|---|---|---|---|---|
| 8,716,708 | B2 * | 5/2014 | Yamazaki | ......... H01L 29/41733 257/43 |
| 2001/0026125 | A1 * | 10/2001 | Yamazaki | ........... H01L 27/3246 313/505 |
| 2004/0061176 | A1 * | 4/2004 | Takafuji | ............ H01L 21/76254 257/347 |
| 2005/0007316 | A1 * | 1/2005 | Akimoto | .............. G09G 3/3233 345/76 |
| 2005/0236629 | A1 | 10/2005 | Lee et al. | |
| 2011/0186847 | A1 | 8/2011 | Kim et al. | |
| 2012/0146030 | A1 | 6/2012 | You et al. | |
| 2013/0001533 | A1 | 1/2013 | Kim et al. | |

FOREIGN PATENT DOCUMENTS

| | | | |
|---|---|---|---|
| KR | 10-2005-0098596 A | 10/2005 | |
| KR | 10-2011-0090308 A | 8/2011 | |
| KR | 10-2012-0066492 A | 6/2012 | |
| KR | 10-2012-0093800 A | 8/2012 | |
| KR | 10-2013-0007006 A | 1/2013 | |
| KR | 10-2013-0071823 A | 7/2013 | |

* cited by examiner

*Primary Examiner* — Seahvosh Nikmanesh
(74) *Attorney, Agent, or Firm* — Knobbe Martens Olson & Bear LLP

(57) ABSTRACT

An organic light-emitting diode (OLED) display and a method of manufacturing the OLED display are disclosed. In one aspect, the OLED display includes a substrate including a display region and a peripheral region, a first auxiliary electrode formed in the peripheral region, and a protecting electrode. The protecting electrode can be formed in the display region and the peripheral region, wherein at least a portion of the protecting electrode can be formed above the first auxiliary electrode.

15 Claims, 5 Drawing Sheets

ORGANIC LIGHT-EMITTING DIODE (OLED) DISPLAY AND METHOD OF MANUFACTURING THE SAME

CROSS-REFERENCE TO RELATED APPLICATIONS

This application claims priority under 35 U.S.C. §119 to Korean patent Application No. 2013-0141917 filed on Nov. 21, 2013, the disclosure of which is hereby incorporated by reference herein in its entirety.

BACKGROUND

Field

The described technology generally relates to an organic light-emitting diode (OLED) display.

Description of the Related Technology

Active matrix organic light-emitting diode (AMOLED) displays are in wide use. It is known that as the area of an AMOLED display increases, resistance of the display's cathode electrodes increases proportionally. The higher the resistance, the greater the voltage drop. As a result, different voltages are applied to the pixels in the display panel. This results in non-uniformity of luminance and a reduction in the image quality. Accordingly, an auxiliary electrode can be included in the display. However, the introduction of an auxiliary electrode causes a reduction in the aperture ratio.

SUMMARY OF CERTAIN INVENTIVE ASPECTS

One inventive aspect is an organic light-emitting diode (OLED) display including an auxiliary electrode between insulating layers.

Another aspect is a method of manufacturing the OLED display including the auxiliary electrode between insulating layers.

Another aspect is an OLED display that includes a substrate, a switching element, a first insulating layer, a first auxiliary electrode, a second insulating layer, an anode electrode, a protecting electrode, a pixel defining layer, an emission layer, a cathode electrode. The substrate can include a display region and a peripheral region. The switching element can be disposed on the substrate, and the switching element can include an active layer, a gate insulating layer, a gate electrode, an insulating interlayer, a first electrode, and a second electrode. The first insulating layer can be disposed on the switching element. The first auxiliary electrode can be disposed on one region of the first insulating layer that overlaps the peripheral region. The second insulating layer can be disposed on the first insulating layer. The anode electrode can be disposed on one region of the second insulating layer that overlaps the display region, and the anode electrode can be electrically connected with the first electrode of the switching element through a first opening. The protecting electrode can be disposed apart from the anode electrode on another region of the second insulating layer that overlaps the peripheral region. The protecting electrode can be electrically connected with the first auxiliary electrode through a second opening. The pixel defining layer can be disposed on the second insulating layer, and the pixel defining layer can separate the display region and the peripheral region. The emission layer can be disposed on the anode electrode. The cathode electrode can be disposed on the protecting electrode, the pixel defining layer, and the emission layer.

In example embodiments, the first auxiliary electrode can be disposed between the first insulating layer and the second insulating layer.

In some example embodiments, the protecting electrode, the anode electrode and the first auxiliary electrode can have a stacked structure.

In example embodiments, the first auxiliary electrode can be electrically connected to the cathode electrode through the protecting electrode.

In example embodiments, the anode electrode and the protecting electrode can be simultaneously formed using the same material.

In example embodiments, the first insulating layer and the second insulating layer can include organic materials.

In example embodiments, the organic light-emitting diode display can further include a second auxiliary electrode can be disposed between the first electrode and the anode electrode.

In example embodiments, the first auxiliary electrode and the second auxiliary electrode can be simultaneously formed using the same material.

In example embodiments, the second auxiliary electrode can have a stacked structure.

In example embodiments, the first electrode can be electrically connected to the anode electrode by the second auxiliary electrode.

Another aspect is a method of manufacturing an OLED display. In the method, a substrate including a display region and a peripheral region can be formed. A switching element can be formed on the substrate, and the switching element can include an active layer, a gate insulating layer, a gate electrode, an insulating interlayer, a first electrode, and a second electrode. A first insulating layer can be formed on the switching element. A first auxiliary electrode can be formed on one region of the first insulating layer that overlaps the peripheral region. A second insulating layer can be formed on the first insulating layer. An anode electrode can be formed on one region of the second insulating layer that overlaps the display region, and the anode electrode can be electrically connected with the first electrode of the switching element through a first opening. A protecting electrode that is disposed apart from the anode electrode on another region of the second insulating layer that overlaps the peripheral region. The protecting electrode can be electrically connected with the first auxiliary electrode through a second opening. A pixel defining layer can be formed on the second insulating layer, and the pixel defining layer can separate the display region and the peripheral region. An emission layer can be formed on the anode electrode. A cathode electrode can be formed on the protecting electrode, the pixel defining layer, and the emission layer.

In example embodiments, the first auxiliary electrode can be disposed between the first insulating layer and the second insulating layer.

In some example embodiments, the protecting electrode, the anode electrode and the first auxiliary electrode can have a stacked structure.

In example embodiments, the first auxiliary electrode can be electrically connected to the cathode electrode through the protecting electrode.

In example embodiments, the anode electrode and the protecting electrode can be simultaneously formed using the same material.

In example embodiments, the first insulating layer and the second insulating layer can include organic materials.

In example embodiments, a method of manufacturing an organic light-emitting diode display can further include forming a second auxiliary electrode between the first electrode and the anode electrode.

In example embodiments, the first auxiliary electrode and the second auxiliary electrode can be simultaneously formed using the same material.

In example embodiments, the second auxiliary electrode can have a stacked structure.

In example embodiments, the first electrode can be electrically connected to the anode electrode through the second auxiliary electrode.

Another aspect is an organic light-emitting diode (OLED) display, comprising: a substrate including a display region and a peripheral region; a switching element formed over the substrate, wherein the switching element includes an active layer, a gate insulating layer, a gate electrode, an insulating interlayer, a first electrode, and a second electrode; a first insulating layer formed over the switching element; a first auxiliary electrode formed over one region of the first insulating layer that substantially overlaps the peripheral region; a second insulating layer formed over the first insulating layer; an anode electrode formed over a first region of the second insulating layer that substantially overlaps the display region, wherein the anode electrode is electrically connected to the first electrode of the switching element via a first opening; a protecting electrode formed apart from the anode electrode on a second region of the second insulating layer that substantially overlaps the peripheral region, wherein the protecting electrode is electrically connected to the first auxiliary electrode via a second opening; a pixel defining layer formed over the second insulating layer, wherein the pixel defining layer separates the display region and the peripheral region; an emission layer formed over the anode electrode; and a cathode electrode formed over the protecting electrode, the pixel defining layer, and the emission layer.

In the above display, the first auxiliary electrode is formed between the first and second insulating layers. In the above display, the protecting electrode, the anode electrode, and the first auxiliary electrode have a stacked structure. In the above display, the first auxiliary electrode is electrically connected to the cathode electrode through the protecting electrode. In the above display, the anode electrode and the protecting electrode are formed of the same material.

In the above display, each of the first and second insulating layers is formed at least partially of an organic material. The above display further comprises a second auxiliary electrode formed between the first electrode and the anode electrode. In the above display, the first and second auxiliary electrodes are formed of the same material. In the above display, the second auxiliary electrode has a stacked structure. In the above display, the first electrode is electrically connected to the anode electrode via the second auxiliary electrode.

Another aspect is a method of manufacturing an OLED display, the method comprising: forming a substrate including a display region and a peripheral region; forming a switching element over the substrate, wherein the switching element includes an active layer, a gate insulating layer, a gate electrode, an insulating interlayer, a first electrode, and a second electrode; forming a first insulating layer over the switching element; forming a first auxiliary electrode on one region of the first insulating layer that substantially overlaps the peripheral region; forming a second insulating layer over the first insulating layer; forming an anode electrode on a first region of the second insulating layer that substantially overlaps the display region, wherein the anode electrode is electrically connected to the first electrode of the switching element via a first opening; forming a protecting electrode to be spaced apart from the anode electrode on a second region of the second insulating layer that substantially overlaps the peripheral region, wherein the protecting electrode is electrically connected to the first auxiliary electrode via a second opening; forming a pixel defining layer over the second insulating layer, wherein the pixel defining layer separates the display region and the peripheral region; forming an emission layer over the anode electrode; and forming a cathode electrode over the protecting electrode, the pixel defining layer, and the emission layer.

In the above method, the first auxiliary electrode is formed between the first and second insulating layers. In the above method, the first auxiliary electrode is thinner than the second insulating layer. In the above method, side surfaces of the first auxiliary electrode are substantially covered by the second insulating layer. The above method further comprises forming a second auxiliary electrode between the first electrode and the anode electrode. In the above method, the first auxiliary electrode and the second auxiliary electrode are substantially simultaneously formed using the same material, and wherein the first auxiliary electrode and a portion of the second auxiliary electrode are formed on the same layer.

Another aspect is an organic light-emitting diode (OLED) display, comprising: a substrate including a display region and a peripheral region; a first auxiliary electrode formed in the peripheral region; and a protecting electrode formed in the display region and the peripheral region, wherein at least a portion of the protecting electrode is formed substantially directly above the first auxiliary electrode.

The above OLED further comprises a second auxiliary electrode formed in the display region, wherein the first and second auxiliary electrodes are formed of the same material, and wherein the second auxiliary electrode is spaced apart from the first auxiliary electrode. In the above OLED, the portion of the protecting electrode contacts the first auxiliary electrode.

Another aspect is a method of manufacturing an organic light-emitting diode (OLED) display, the method comprising: forming a substrate including a display region and a peripheral region; forming a first auxiliary electrode in the peripheral region; and forming a protecting electrode in the display region and the peripheral region, wherein at least a portion of the protecting electrode is formed directly above the first auxiliary electrode.

The above method further comprises forming a second auxiliary electrode in the display region, wherein the first and second auxiliary electrodes are substantially simultaneously formed using the same material, and wherein the second auxiliary electrode is spaced apart from the first auxiliary electrode. The above method further comprises forming, before forming the protecting electrode, an insulating layer substantially covering the first auxiliary electrode, wherein the insulating layer is thicker than the first auxiliary electrode.

According to at least one embodiment, the above OLED display can substantially prevent an auxiliary electrode placed between insulating layers from being damaged based on a protecting electrode that substantially protects the auxiliary electrode. In addition, the organic light-emitting diode display can reduce (or, minimize) a voltage drop and a reduction of an opening ratio by arranging the auxiliary electrode between the insulating layers.

In addition, the above method can substantially prevent an auxiliary electrode from being damaged based on a protecting electrode that is placed on the auxiliary electrode. In addition, the method can reduce (or, minimize) a voltage drop and a reduction of an opening ratio by arranging the auxiliary electrode between the insulating layers.

BRIEF DESCRIPTION OF THE DRAWINGS

Example embodiments can be understood in more detail from the following description taken in conjunction with the accompanying drawings.

DETAILED DESCRIPTION OF CERTAIN INVENTIVE EMBODIMENTS

Figure 1:
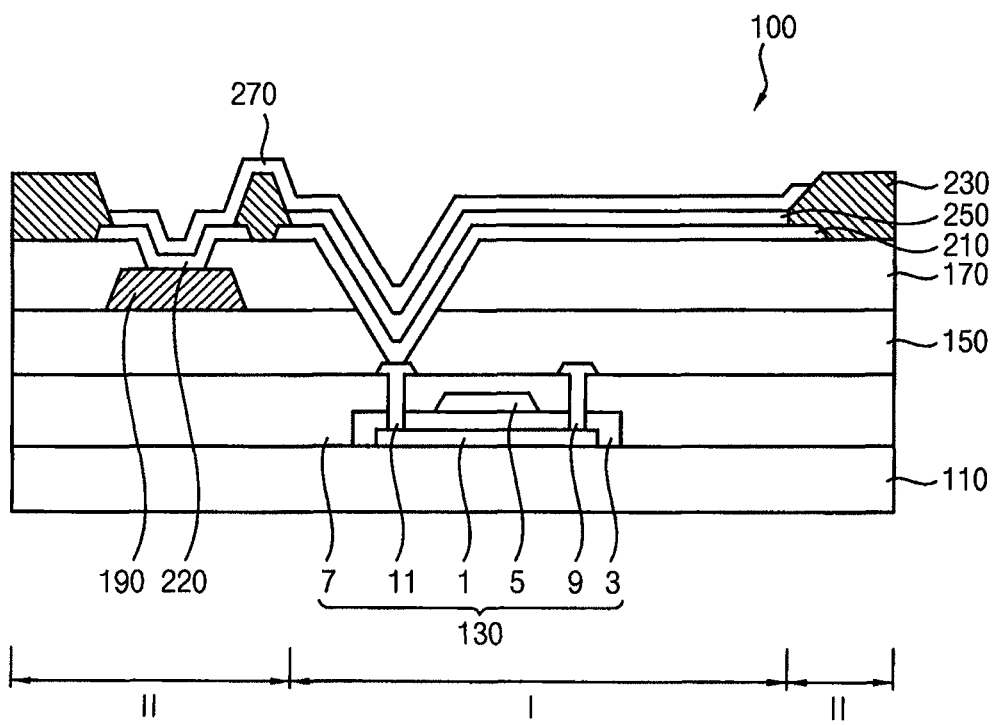
FIG. 1 is a cross-sectional view illustrating an organic light-emitting diode (OLED) display in accordance with example embodiments.

Hereinafter, example embodiments of the described technology will be described in detail with reference to the accompanying drawings. In the drawings, identical or similar reference numerals can represent identical or similar elements.

FIG. 1 is a cross-sectional view illustrating an organic light-emitting diode (OLED) display 100 in accordance with example embodiments.

Referring FIG. 1, the OLED display 100 can include a substrate 110, a switching element 130, a first insulating layer 150, a first auxiliary electrode 190, a second insulating layer 170, an anode electrode 210, a protecting electrode 220, a pixel defining layer 230, an emission layer 250, and a cathode electrode 270.

The substrate 110 can have a display region I and a peripheral region II. In some embodiments, the peripheral region II surrounds the display region I. The substrate 110 can be formed at least partially of a transparent inorganic material or a flexible plastic material. For example, the substrate 110 can include a glass substrate, a quartz substrate or a transparent resin substrate, etc.

The switching element 130 can be a thin film transistor (TFT) formed on (hereinafter, "formed on" can also mean "formed over") the substrate 110. For example, the switching element 130 can correspond to a transistor that includes an active layer 1, a gate insulating layer 3, a gate electrode 5, an insulating interlayer 7, a first electrode 11, and a second electrode 9.

The active layer 1 can be formed at least partially of amorphous silicon, polysilicon, or organic semiconductor materials. For example, the active layer 1 can be formed at least partially of indium (In), gallium (Ga), zinc (Zn) or a combination thereof. The active layer 1 can be electrically connected to the first electrode 11 and the second electrode 9 through openings of the insulating interlayer 7.

The gate insulating layer 3 can be formed between the gate electrode 5 and the active layer 1. The gate insulating layer 3 can substantially cover the active layer 1. The gate insulating layer 3 can electrically insulate the gate electrode 5 and the active layer 1. For example, the gate insulating layer 3 can be formed at least partially of silicon oxide (SiOx), silicon nitride (SiNx), silicon oxynitride (SiOxNy), silicon oxycarbide (SiOxCy), silicon cabonitride (SiCxNy), hafnium oxide (HfOx), aluminum oxide (AlOx), zirconium oxide (ZrOx), titanium oxide (TiOx), tantalum oxide (TaOx) or a combination thereof.

In some embodiments, as illustrated in FIG. 1, the gate electrode 5 is formed on the gate insulating layer 3, that creates a top gate structure. The gate electrode 5 can be formed at least partially of metal, alloy, metallic nitride, conductive metal oxide, a transparent conductive material or a combination thereof. For example, the gate electrode 5 can be formed at least partially of aluminum (Al), aluminum alloy, aluminum nitride (AlNx), silver (Ag), silver alloy, tungsten (W), tungsten nitride (WNx), copper (Cu), copper alloy, nickel (Ni), chrome (Cr), chrome nitride (CrNx), molybdenum (Mo), molybdenum alloy, titanium (Ti), titanium nitride (TiNx), platinum (Pt), tantalum (Ta), tantalum nitride (TaNx), neodymium (Nd), scandium (Sc), strontium ruthenium oxide (SRO), zinc oxide (ZnOx), indium tin oxide (ITO), stannum oxide (SnOx), indium oxide (InOx), gallium oxide (GaOx), indium zinc oxide (IZO) or a combination thereof. In some embodiments, the gate electrode 5 can be formed under the gate insulating layer 3 that creates a bottom gate structure.

The insulating interlayer 7 can be formed on the gate insulating layer 3 and the gate electrode 5. The insulating interlayer 7 can include two openings. The second and first electrodes 9 and 11 can be electrically connected to the active layer 1 through the two openings. The insulating interlayer 7 can be formed at least partially of inorganic materials. For example, the insulating interlayer 7 can be formed at least partially of silicon compounds such as silicon oxide, silicon nitride, silicon oxynitride, silicon oxycarbide, silicon cabonitride or a combination thereof. In some embodiments, the insulating interlayer 7 can be formed at least partially of organic materials. For example, the insulating interlayer 7 can be formed at least partially of polyimide-based resin, photoresist, acrylic-based resin, polyamide-based resin, siloxane-based resin or a combination thereof.

The first and second electrodes 11 and 9 can be formed on the insulating interlayer 7. The first and second electrodes 11 and 9 can be electrically connected to the active layer 1 through the openings. The first electrode 11 can be electrically connected to the anode electrode 210 through a first opening. In some embodiments, when the switching element 130 corresponds to an N-channel metal oxide semiconductor (NMOS) transistor, the first electrode 11 can be a source electrode, and the second electrode 9 can be a drain electrode. In some embodiments, when the switching element 130 corresponds to a P-channel metal oxide semiconductor (PMOS) transistor, the first electrode 11 can be a drain electrode, and the second electrode 9 can be a source electrode. For example, the first and second electrodes 11 and 9 can be formed at least partially of metal, alloy, metallic nitride, conductive metal oxide, a transparent conductive material or a combination thereof. For example, the first electrode 11 can be formed at least partially of aluminum, aluminum alloy, aluminum nitride, silver, silver alloy, tungsten, tungsten nitride, copper, copper alloy, nickel, chrome, chrome nitride, molybdenum, molybdenum alloy, titanium, titanium nitride, platinum, tantalum, tantalum nitride, neodymium, scandium, strontium ruthenium oxide, zinc oxide, indium tin oxide, stannum oxide, indium oxide, gallium oxide, indium zinc oxide or a combination thereof.

The first insulating layer 150 can be formed on the switching element 130. The second insulating layer 170 can be formed on the first insulating layer 150. The first insulating layer 150 can include the first opening. The second insulating layer 170 can include the first opening and a second opening. The anode electrode 210 can be electrically connected to the first electrode 11 through the first opening.

The first auxiliary electrode 190 can be electrically connected to the protecting electrode 220 through the second opening. The first insulating layer 150 and the second insulating layer 170 can be formed at least partially of organic materials. For example, the first insulating layer 150 and the second insulating layer 170 can be formed at least partially of polyimide-based resin, photoresist, acrylic-based resin, polyamide-based resin, siloxane-based resin or a combination thereof. When the first and second insulating layers 150 and 170 are formed, the first auxiliary electrode 190 can be formed between the two insulating layers 150 and 170. For example, the first auxiliary electrode 190 can be formed under the anode electrode 210. The first auxiliary electrode 190 can also be formed without a reduction of an opening ratio of the OLED display 100 (i.e., without a reduction of a region that emits a light in the OLED display 100).

In some embodiments as shown in FIG. 1, the first auxiliary electrode 190 is formed on a first region of the first insulating layer 150 that substantially overlaps the peripheral region II. As described above, the first auxiliary electrode 190 can be formed between the first and second insulating layers 150 and 170. When the first auxiliary electrode 190 is formed between the two insulating layers 150 and 170, the first auxiliary electrode 190 can be substantially protected from external materials (e.g., a solution used on the anode electrode while a wet etching of the anode electrode is performed) by the protecting electrode 220. When the protecting electrode 220 is not formed on the first auxiliary electrode 190, the external materials can be electrically connected to the first auxiliary electrode 190 through the second opening. That is, the first auxiliary electrode 190 can be damaged from the external materials. Also, when the first auxiliary electrode 190 is formed between the first and second insulating layers 150 and 170, the thickness of the first auxiliary electrode 190 can be greater than that of the first auxiliary electrode 190 that would be formed without the two insulating layers 150 and 170. Accordingly, when the thickness of the first auxiliary electrode 190 increases, the resistance of the first auxiliary electrode 190 decreases. In addition, when the OLED display 100 becomes larger, a voltage drop across the above-mentioned electrodes can be substantially prevented. Further, a non-uniformity of luminance (or non-uniformity of image quality) can also be substantially prevented.

In some embodiments, the first auxiliary electrode 190 can be formed to have a stacked structure in which at least two layers are stacked. For example, a bottom layer of the first auxiliary electrode 190 can be formed at least partially of indium tin oxide, etc. A top layer of the first auxiliary electrode 190 can be formed at least partially of aluminum, aluminum alloy, aluminum nitride, silver, silver alloy, tungsten, tungsten nitride, copper, copper alloy, nickel, chrome, chrome nitride, molybdenum, molybdenum alloy, titanium, titanium nitride, platinum, tantalum, tantalum nitride, neodymium, scandium, strontium ruthenium oxide, zinc oxide, indium tin oxide, stannum oxide, indium oxide, gallium oxide, indium zinc oxide or a combination thereof.

The anode electrode 210 can be formed on a first region of the second insulating layer 170 that substantially overlaps the display region I. The anode electrode 210 can be electrically connected to the first electrode 11. The anode electrode 210 and the protecting electrode 220 can be substantially simultaneously formed using the same material. For example, a spare electrode (not shown) can be formed on the second insulating layer 170 and the first auxiliary electrode 190. By using a wet etching technique or a patterning technique using masks, etc., the spare electrode can be formed as the anode electrode 210 and the protecting electrode 220 formed apart from the anode electrode 210 on a second region of the second insulating layer 170 that substantially overlaps the peripheral region II.

In some embodiments, the anode electrode 210 can be formed to have a stacked structure of at least three layers. For example, a bottom layer and a top layer of the anode electrode 210 can be formed at least partially of indium tin oxide, etc. A middle layer of the anode electrode 210 can be formed at least partially of aluminum, aluminum alloy, aluminum nitride, silver, silver alloy, tungsten, tungsten nitride, copper, copper alloy, nickel, chrome, chrome nitride, molybdenum, molybdenum alloy, titanium, titanium nitride, platinum, tantalum, tantalum nitride, neodymium, scandium, strontium ruthenium oxide, zinc oxide, indium tin oxide, stannum oxide, indium oxide, gallium oxide, indium zinc oxide or a combination thereof. The protecting electrode 220 can have substantially the same structure as the anode electrode 210.

The pixel defining layer 230 can be formed on the second insulating layer 170. The pixel defining layer 230 can substantially separate the display region I and the peripheral region II. A region in which the emission layer 250 is exposed by the pixel defining layer 230 can include the display region I. A region adjacent to thereof can include the peripheral region II. In some embodiments, the pixel defining layer 230 can be formed at least partially of inorganic insulating materials such as silicon oxide, silicon nitride, silicon oxynitride, silicon oxycarbide, silicon cabonitride or a combination thereof. In some embodiments, the pixel defining layer 230 can be formed at least partially of organic insulating materials. For example, the pixel defining layer 230 can be formed at least partially of polyimide-based resin, photoresist, acrylic-based resin, polyamide-based resin, siloxane-based resin or a combination thereof.

The emission layer 250 can be formed on the anode electrode 210. The emission layer 250 can include a hole injection layer (HIL), a hole transfer layer (HTL), an organic light-emitting layer (EL), an electron transfer layer (ETL) or an electron injection layer (EIL), etc. In some embodiments, the organic light-emitting layer can be formed at least partially of light-emitting materials that can generate different colors of light such as red, green, and blue according to the type of pixels. In some embodiments, the organic light-emitting layer can generate a white color of light by stacking the light-emitting materials.

The cathode electrode 270 can be formed on the protecting electrode 220, the pixel defining layer 230, and the emission layer 250. The cathode electrode 270 can be electrically connected to the first auxiliary electrode 190 through the protecting electrode 220. The cathode electrode 270 can be formed at least partially of aluminum, aluminum alloy, aluminum nitride, silver, silver alloy, tungsten, tungsten nitride, copper, copper alloy, nickel, chrome, chrome nitride, molybdenum, molybdenum alloy, titanium, titanium nitride, platinum, tantalum, tantalum nitride, neodymium, scandium, strontium ruthenium oxide, zinc oxide, indium tin oxide, stannum oxide, indium oxide, gallium oxide, indium zinc oxide or a combination thereof.

FIGS. 2A to 2H are cross-sectional views illustrating a method of manufacturing the OLED display 100 in accordance with example embodiments.

Figure 2A:
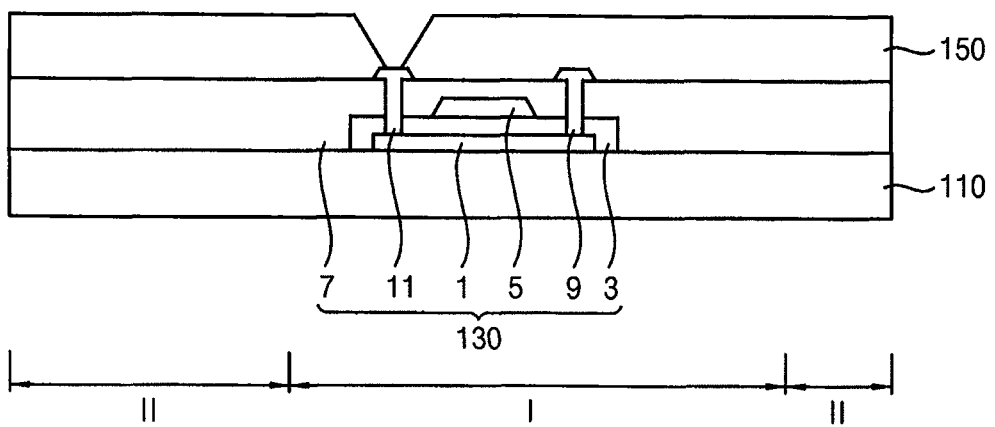
FIGS. 2A through 2H are cross-sectional views illustrating a method of manufacturing the OLED pixel in accordance with example embodiments.

Referring to FIG. 2A, the substrate 110 including the display region I and the peripheral region II is formed. The switching element 130 can be formed on the display region I. The switching element 130 can include the active layer 1, the gate insulating layer 3, the gate electrode 5, the insulating interlayer 7, the first electrode 11, and the second electrode 9. In addition, the first insulating layer 150 can be formed on the switching element 130. The first insulating layer 150 can be formed in both the display region I and the peripheral region II. The first insulating layer 150 can include the first opening through which the first electrode 11 is at least partially exposed.

Figure 2B:
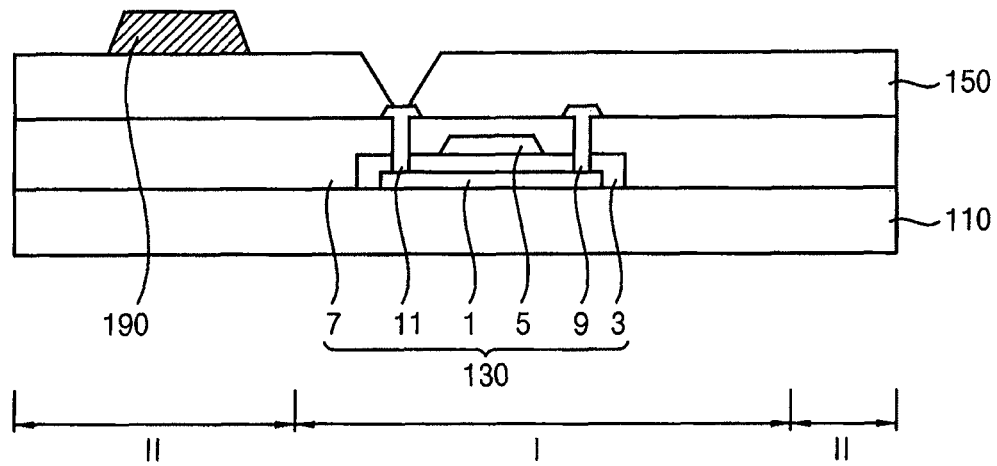

Referring to FIG. 2B, the first auxiliary electrode 190 can be formed on the first region of the first insulating layer 150. The width of the first auxiliary electrode 190 can be less or significantly less than that of the first insulating layer 150.

Figure 2C:
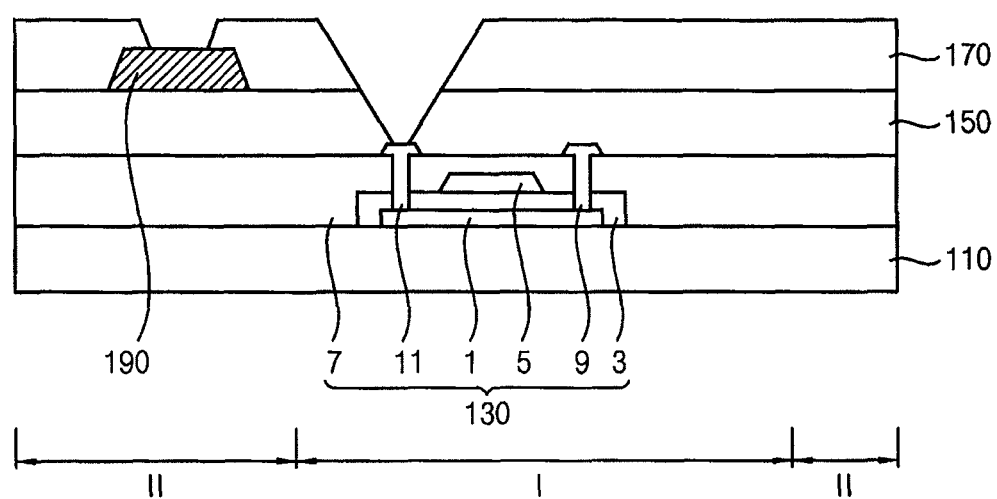

In some embodiments as shown in FIG. 2C, the second insulating layer 170 is formed on the first insulating layer 170 and the first auxiliary electrode 190. The second insulating layer 170 can include the first opening and the second opening. The first opening at least partially exposes the first electrode 11. The second opening at least partially exposes the first auxiliary electrode 190. The anode electrode 210 can contact the first electrode 11. The first auxiliary electrode 190 can contact the protecting electrode 220 through the second opening. The thickness of the first auxiliary electrode 190 can be less than that of the second insulating layer 170.

Figure 2D:
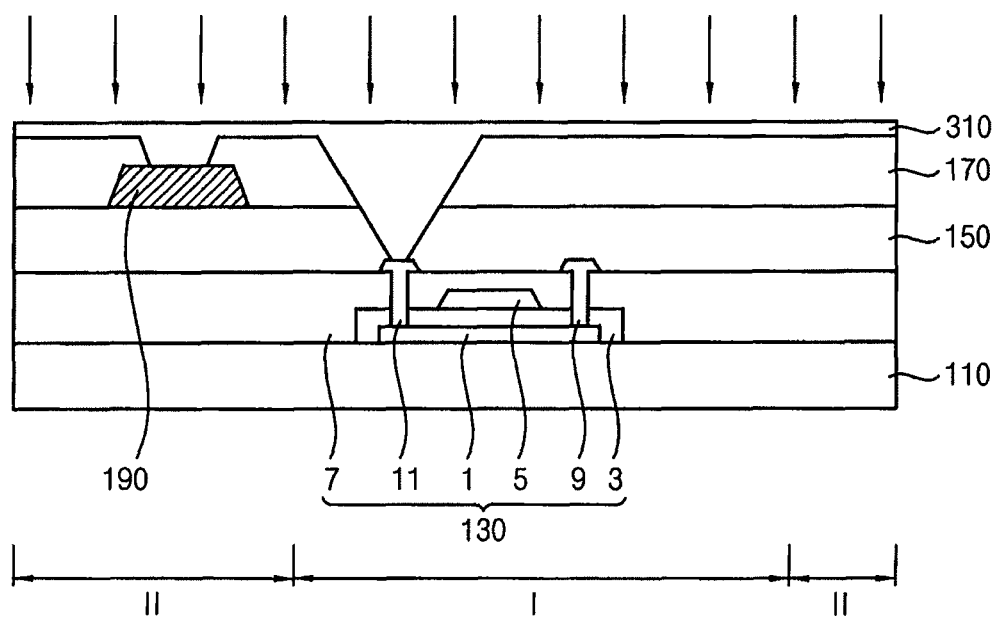
Figure 2E:
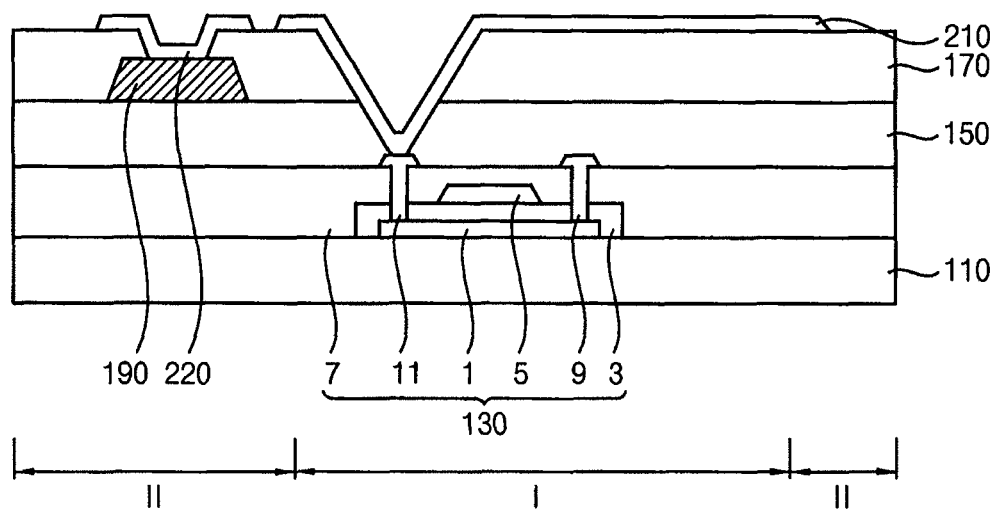

In some embodiments as shown in FIGS. 2D and 2E, the spare electrode 310 is formed on the second insulating layer 170 and the first auxiliary electrode 190. The spare electrode 310 also substantially covers the first and second openings. Using methods of wet etching or patterning by using a mask, etc., the spare electrode 310 can be formed as the anode electrode 210 on the first region of the second insulating layer 170. Furthermore, the protecting electrode 220 can be formed apart from the anode electrode 210 on the second region of the second insulating layer 170. The protecting electrode 220 can contact and substantially overlap the first auxiliary electrode 190. The anode electrode 210 can contact the first electrode 11.

Figure 2F:
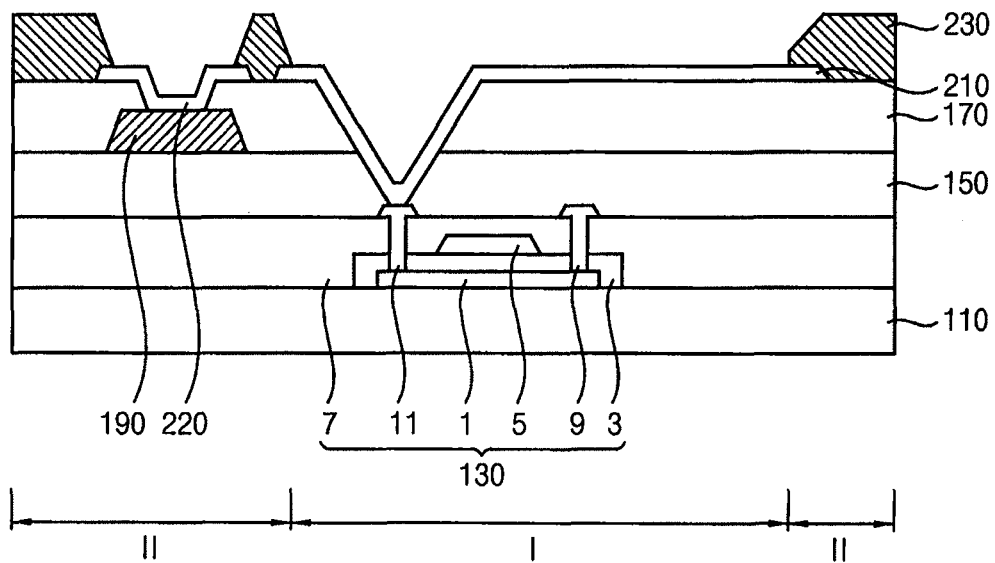

In some embodiments as shown in FIG. 2F, the pixel defining layer 230 separating the display region I and the peripheral region II is formed on the second insulating layer 170. At least a portion of the pixel defining layer 230 can be formed only in the peripheral region II. In some embodiments, at least a portion of the first auxiliary electrode 190 does not overlap the pixel defining layer 230.

Figure 2G:
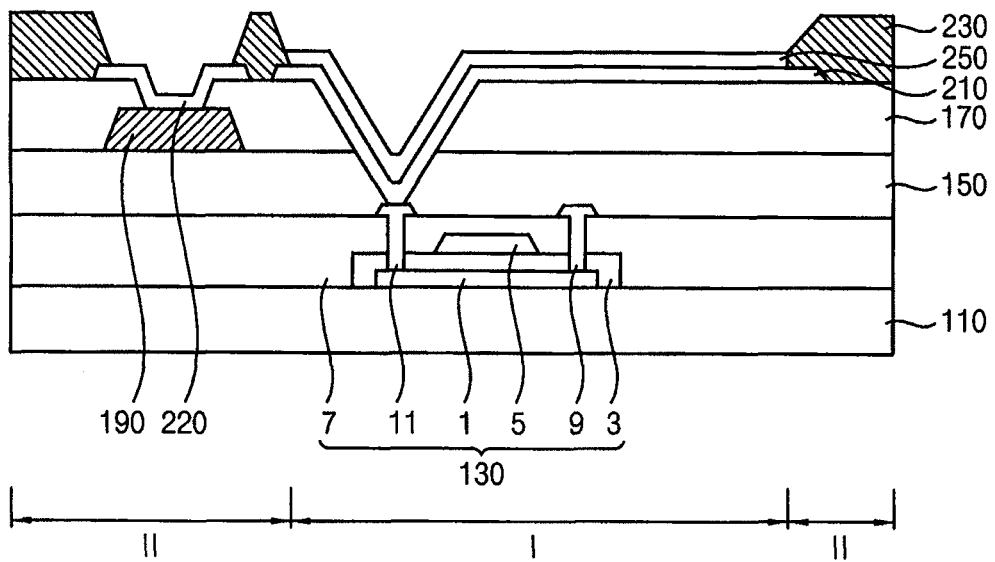

In some embodiments as shown in FIG. 2G, the emission layer 250 is formed on the anode electrode 210. The emission layer 250 can be formed only in the display region I and substantially overlap the anode electrode 210. The emission layer 250 can include the hole injection layer (HIL), the hole transfer layer (HTL), an organic light-emitting layer, the electron transfer layer (ETL) or the electron injection layer (EIL), etc. In some embodiments, the organic light-emitting layer can be formed at least partially of light-emitting materials capable of generating different colors of light such as red, blue, and green according to the type of the pixels in the OLED display 100. In some embodiments, the organic light-emitting layer can generate substantially white color of light by stacking the light-emitting materials.

Figure 2H:
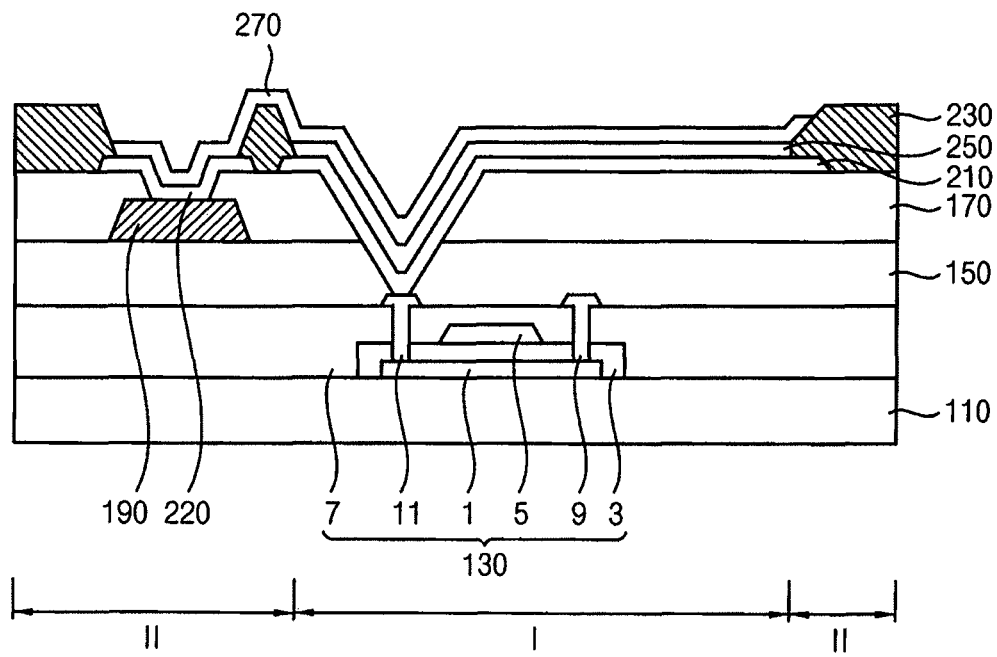

In some embodiments as shown in FIG. 2H, a cathode electrode 270 can be formed on the first auxiliary electrode 190, the pixel defining layer 230, and the emission layer 250. At least a portion of the cathode electrode 270 can be formed directly above the first auxiliary electrode 190 and the protecting electrode 220. The cathode electrode 270 can be electrically connected to the first auxiliary electrode 190 through the protecting electrode 220.

As described above, the method of manufacturing the OLED display 100 according to example embodiments includes forming the protecting electrode 220 on the first auxiliary electrode 190 while the anode electrode 210 and the protecting electrode 220 are already formed. Thus the OLED display 100 can be manufactured without damage to the first auxiliary electrode 190.

Figure 3:
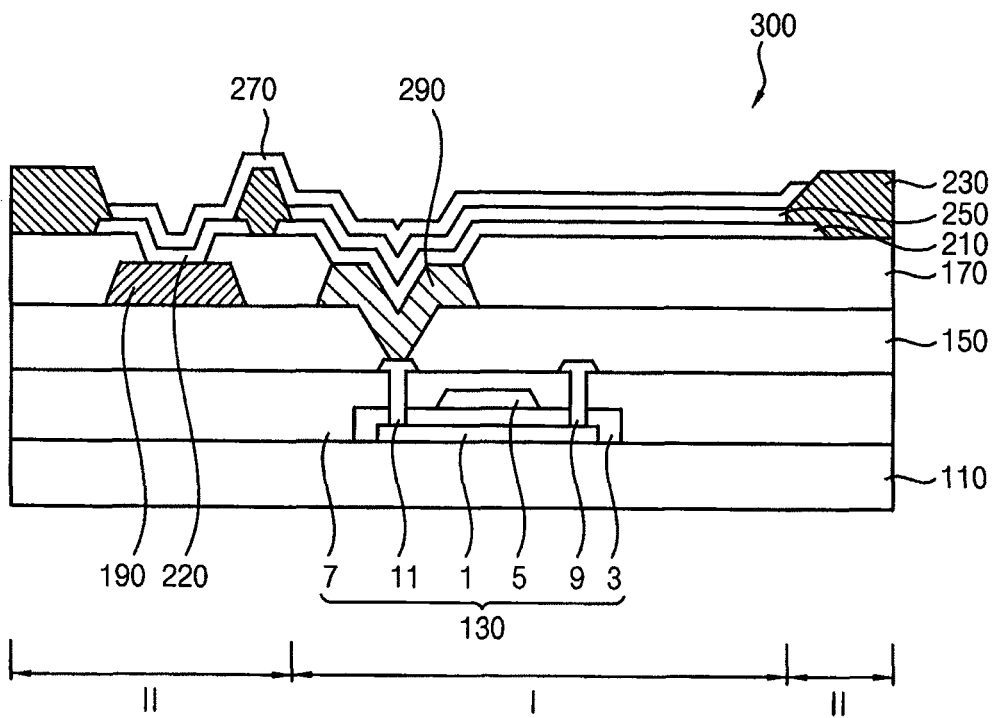
FIG. 3 is a cross-sectional view illustrating the OLED pixel in accordance with example embodiments.

FIG. 3 is a cross-sectional view illustrating an OLED display 300 in accordance with example embodiments. The OLED display 300 can have a structure substantially the same as that of the OLED display 100 described with reference to FIG. 1, except that the OLED display 300 includes a second auxiliary electrode 290.

In some embodiments as shown in FIG. 3, the second auxiliary electrode 290 is formed on the first insulating layer 150. The second auxiliary electrode 290 can electrically connect the first electrode 11 and the anode electrode 210. The second auxiliary electrode 290 and the first auxiliary electrode 190 can be substantially simultaneously formed using the same material. For example, the spare electrode 310 (see FIG. 2D) can be formed on the first insulating layer 150. Using methods of wet etching or patterning by using a mask, etc., the spare electrode can be formed as the first auxiliary electrode 190 and the second auxiliary electrode 290 formed apart from the first auxiliary electrode 190. The second auxiliary electrode 290 can be formed only in the display region I. In some embodiments, the second auxiliary electrode 290 does not contact the first auxiliary electrode 190. At least a portion of the second auxiliary electrode 290 can be formed substantially directly above the first electrode 11. In some embodiments, the first auxiliary electrode 190 and the second auxiliary electrode 290 can be formed to have a stacked structure in which at least two layers are stacked. For example, the bottom layer of the first auxiliary electrode 190 and a bottom layer of the second auxiliary electrode 290 can be formed at least partially of indium tin oxide, etc. The top layer of the first auxiliary electrode 190 and a top layer of the second auxiliary electrode 290 can be formed at least partially of aluminum, aluminum alloy, aluminum nitride, silver, silver alloy, tungsten, tungsten nitride, copper, copper alloy, nickel, chrome, chrome nitride, molybdenum, molybdenum alloy, titanium, titanium nitride, platinum, tantalum, tantalum nitride, neodymium, scandium, strontium ruthenium oxide, zinc oxide, indium tin oxide, stannum oxide, indium oxide, gallium oxide, indium zinc oxide or a combination thereof.

As described above, the OLED display 300 according to example embodiments includes the protecting electrode 220. The OLED display 100 can be manufactured without damage to the first auxiliary electrode 190. Also, when the second auxiliary electrode 290 is formed between the first electrode 11 and the anode electrode 210, the resistance of the first electrode 11 can be reduced. When the first and second auxiliary electrodes 190 and 290 are formed between the first and second insulating layers 150 and 170, the thickness of each of the auxiliary electrodes 190 and 290 can be formed thicker than that of each of the auxiliary electrodes 190 and 290 that would be formed without the insulating layers 150 and 170. Accordingly, as the thickness of each of the first and second auxiliary electrodes 190 and 290 increases, their resistance can be reduced. When the OLED display 300 becomes larger, a voltage drop across the above-mentioned electrodes can be substantially prevented. Also, a non-uniformity of a luminance (or non-uniformity of image quality) can also be substantially prevented.

The described technology can be applied to any electronic device including an OLED display. For example, the described technology can be applied to a mobile phone, a smart phone, a laptop, a tablet, a computer, a personal digital assistant (PDA), a portable multimedia player (PMP), a digital camera, a music player (e.g., MP3 player), a portable game console or a navigation system, etc.

The above description is illustrative of example embodiments and is not to be construed as limiting thereof. Although a few example embodiments have been described, those skilled in the art will readily appreciate that many modifications are possible in the example embodiments without materially departing from the novel teachings and advantages of the invention. Accordingly, all such modifications are intended to be included within the scope of the invention as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. An organic light-emitting diode (OLED) display, comprising:
   a substrate including a display region and a peripheral region;
   a switching element formed over the substrate, wherein the switching element includes an active layer, a gate insulating layer, a gate electrode, an insulating interlayer, a first electrode, and a second electrode;
   a first insulating layer formed over the switching element;
   a first auxiliary electrode formed over one region of the first insulating layer that substantially overlaps the peripheral region;
   a second insulating layer formed over the first insulating layer, the second insulating layer exposing a portion of an upper surface of the first auxiliary electrode and covering both lateral portions of the first auxiliary electrode;
   an anode electrode formed over a first region of the second insulating layer that substantially overlaps the display region, wherein the anode electrode is electrically connected to the first electrode of the switching element via a first opening;
   a protecting electrode formed apart from the anode electrode on a second region of the second insulating layer that substantially overlaps the peripheral region, wherein the protecting electrode is electrically connected to the first auxiliary electrode via a second opening, and wherein the protecting electrode covers the portion of the upper surface of the first auxiliary electrode such that the first auxiliary electrode is not exposed;
   a pixel defining layer formed over the second insulating layer, wherein the pixel defining layer separates the display region and the peripheral region and covers both lateral portions of the first auxiliary electrode and both lateral portions of the anode electrode;
   an emission layer formed over the anode electrode; and
   a cathode electrode formed over the protecting electrode, the pixel defining layer, and the emission layer.

2. The display of claim 1, wherein the first auxiliary electrode is formed between the first and second insulating layers.

3. The display of claim 1, wherein the protecting electrode, the anode electrode, and the first auxiliary electrode have a stacked structure.

4. The display of claim 1, wherein the first auxiliary electrode is electrically connected to the cathode electrode through the protecting electrode.

5. The display of claim 1, wherein the anode electrode and the protecting electrode are formed of the same material.

6. The display of claim 1, wherein each of the first and second insulating layers is formed at least partially of an organic material.

7. The display of claim 1, further comprising a second auxiliary electrode formed between the first electrode and the anode electrode.

8. The display of claim 7, wherein the first and second auxiliary electrodes are formed of the same material.

9. The display of claim 7, wherein the second auxiliary electrode has a stacked structure.

10. The display of claim 7, wherein the first electrode is electrically connected to the anode electrode via the second auxiliary electrode.

11. An organic light-emitting diode (OLED) display, comprising:
    a substrate including a display region and a peripheral region;
    a first auxiliary electrode formed in the peripheral region on the substrate; and
    a protecting electrode formed only in the peripheral region, wherein at least a portion of the protecting electrode is formed above the first auxiliary electrode such that the first auxiliary electrode is not exposed.

12. The OLED display of claim 11, further comprising a second auxiliary electrode formed in the display region, wherein the first and second auxiliary electrodes are formed of the same material, and wherein the second auxiliary electrode is spaced apart from the first auxiliary electrode.

13. The OLED display of claim 12, wherein the portion of the protecting electrode contacts the first auxiliary electrode.

14. The OLED display of claim 11, wherein the auxiliary electrode is electrically connected to the cathode electrode via the protecting electrode.

15. The OLED display of claim 1, wherein a portion of the pixel defining layer is interposed between the protecting electrode and the anode electrode such that the protecting electrode and the anode electrode are not directly connected to each other.

* * * * *